United States Patent
Ho et al.

(10) Patent No.: US 9,793,183 B1
(45) Date of Patent: Oct. 17, 2017

(54) SYSTEM AND METHOD FOR MEASURING AND IMPROVING OVERLAY USING ELECTRONIC MICROSCOPIC IMAGING AND DIGITAL PROCESSING

(71) Applicant: TAIWAN SEMICONDUCTOR MANUFACTURING CO., LTD., Hsin-Chu (TW)

(72) Inventors: Cheng-Ming Ho, Hsin-Chu (TW); Po Shun Lin, Taichung (TW); Venkata Sripathi Sasanka Pratapa, Hsinchu (TW); Yi-Ju Wang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/224,110

(22) Filed: Jul. 29, 2016

(51) Int. Cl.
*H01L 21/66* (2006.01)
*H01L 21/768* (2006.01)
*G06T 7/00* (2017.01)

(52) U.S. Cl.
CPC ............ *H01L 22/20* (2013.01); *G06T 7/0004* (2013.01); *H01L 21/76802* (2013.01); *H01L 21/76816* (2013.01); *G06T 2207/10004* (2013.01); *G06T 2207/30148* (2013.01)

(58) Field of Classification Search
CPC .............. H01L 22/20; H01L 21/76802; H01L 21/76816; G06T 7/0004; G06T 7/001; G06T 2207/10004; G06T 2207/30148
See application file for complete search history.

(56) References Cited

U.S. PATENT DOCUMENTS

| | | |
|---|---|---|
| 6,788,477 B2 | 9/2004 | Lin |
| 8,199,314 B2 | 6/2012 | Peng et al. |
| 8,202,680 B2 | 6/2012 | Chang |
| 8,208,116 B2 | 6/2012 | Lin et al. |
| 8,253,922 B2 | 8/2012 | Lin et al. |
| 8,264,662 B2 | 9/2012 | Chen et al. |
| 8,383,322 B2 | 2/2013 | Chang et al. |
| 8,415,091 B2 | 4/2013 | Chang |
| 8,464,186 B2 | 6/2013 | Wang et al. |
| 8,468,473 B1 | 6/2013 | Wang et al. |
| 8,473,877 B2 | 6/2013 | Wang et al. |
| 8,507,159 B2 | 8/2013 | Wang et al. |
| 8,510,687 B1 | 8/2013 | Liu et al. |
| 8,524,427 B2 | 9/2013 | Shin et al. |
| 8,530,121 B2 | 9/2013 | Wang et al. |

(Continued)

*Primary Examiner* — Yasser A Abdelaziez
(74) *Attorney, Agent, or Firm* — Haynes and Boone, LLP

(57) ABSTRACT

An SEM image is acquired. The SEM image shows a metal line and a via hole disposed above the metal line. The via hole exposes a portion of the metal line vertically aligned with the via hole. A first portion and a second portion of the via hole are each vertically not aligned with the metal line and are disposed on opposite sides of the metal line. The acquired SEM image is processed to enhance a contrast between the first and second portions and their surrounding areas. A first dimension of the first portion and a second dimension of the second portion of the via hole are measured in a first direction. The first direction is different from a second direction along which the metal line extends. An overlay between the via hole and the metal line is determined based on the first dimension and the second dimension.

20 Claims, 10 Drawing Sheets

(56) References Cited

U.S. PATENT DOCUMENTS

| | | |
|---|---|---|
| 8,563,224 B1 | 10/2013 | Chen et al. |
| 8,564,759 B2 | 10/2013 | Chang et al. |
| 8,584,057 B2 | 11/2013 | Liu et al. |
| 8,601,407 B2 | 12/2013 | Wang et al. |
| 8,609,308 B1 | 12/2013 | Chen et al. |
| 8,627,241 B2 | 1/2014 | Wang et al. |
| 8,677,511 B2 | 3/2014 | Wang et al. |
| 8,716,841 B1 | 5/2014 | Chang et al. |
| 8,736,084 B2 | 5/2014 | Cheng et al. |
| 8,762,900 B2 | 6/2014 | Shin et al. |
| 8,767,178 B2 | 7/2014 | Lin et al. |
| 8,802,354 B2 | 8/2014 | Chang |
| 8,822,106 B2 | 9/2014 | Wang et al. |
| 8,828,632 B2 | 9/2014 | Wang et al. |
| 8,835,082 B2 | 9/2014 | Chen et al. |
| 8,837,810 B2 | 9/2014 | Chen et al. |
| 8,841,049 B2 | 9/2014 | Wang et al. |
| 8,841,058 B2 | 9/2014 | Chang |
| 8,846,278 B2 | 9/2014 | Shin et al. |
| 2003/0071997 A1* | 4/2003 | Ausschnitt .......... G03F 7/70633 356/400 |
| 2010/0278416 A1* | 11/2010 | Xiao ................ H01L 21/67242 382/144 |
| 2012/0034558 A1 | 2/2012 | Chang |
| 2012/0045192 A1 | 2/2012 | Peng et al. |
| 2012/0180823 A1 | 7/2012 | Peng et al. |
| 2012/0236276 A1 | 9/2012 | Lin et al. |
| 2012/0308112 A1 | 12/2012 | Hu et al. |
| 2012/0320351 A1 | 12/2012 | Lin et al. |
| 2013/0201461 A1 | 8/2013 | Huang et al. |
| 2013/0216949 A1 | 8/2013 | Chang |
| 2013/0258304 A1 | 10/2013 | Chang et al. |
| 2013/0309611 A1 | 11/2013 | Chang et al. |
| 2014/0101624 A1 | 4/2014 | Wu et al. |
| 2014/0111779 A1 | 4/2014 | Chen et al. |
| 2014/0119638 A1 | 5/2014 | Chang et al. |
| 2014/0123084 A1 | 5/2014 | Tang et al. |
| 2014/0134759 A1 | 5/2014 | Lin et al. |
| 2014/0226893 A1 | 8/2014 | Lo et al. |
| 2014/0253901 A1 | 9/2014 | Zhou et al. |
| 2014/0256067 A1 | 9/2014 | Cheng et al. |
| 2014/0257761 A1 | 9/2014 | Zhou et al. |
| 2015/0116678 A1* | 4/2015 | Chang ................ G03F 7/70633 355/52 |
| 2016/0063167 A1* | 3/2016 | Hamouda .......... G06F 17/5081 716/122 |
| 2017/0052452 A1* | 2/2017 | Mailfert .................. G03F 1/36 |

* cited by examiner

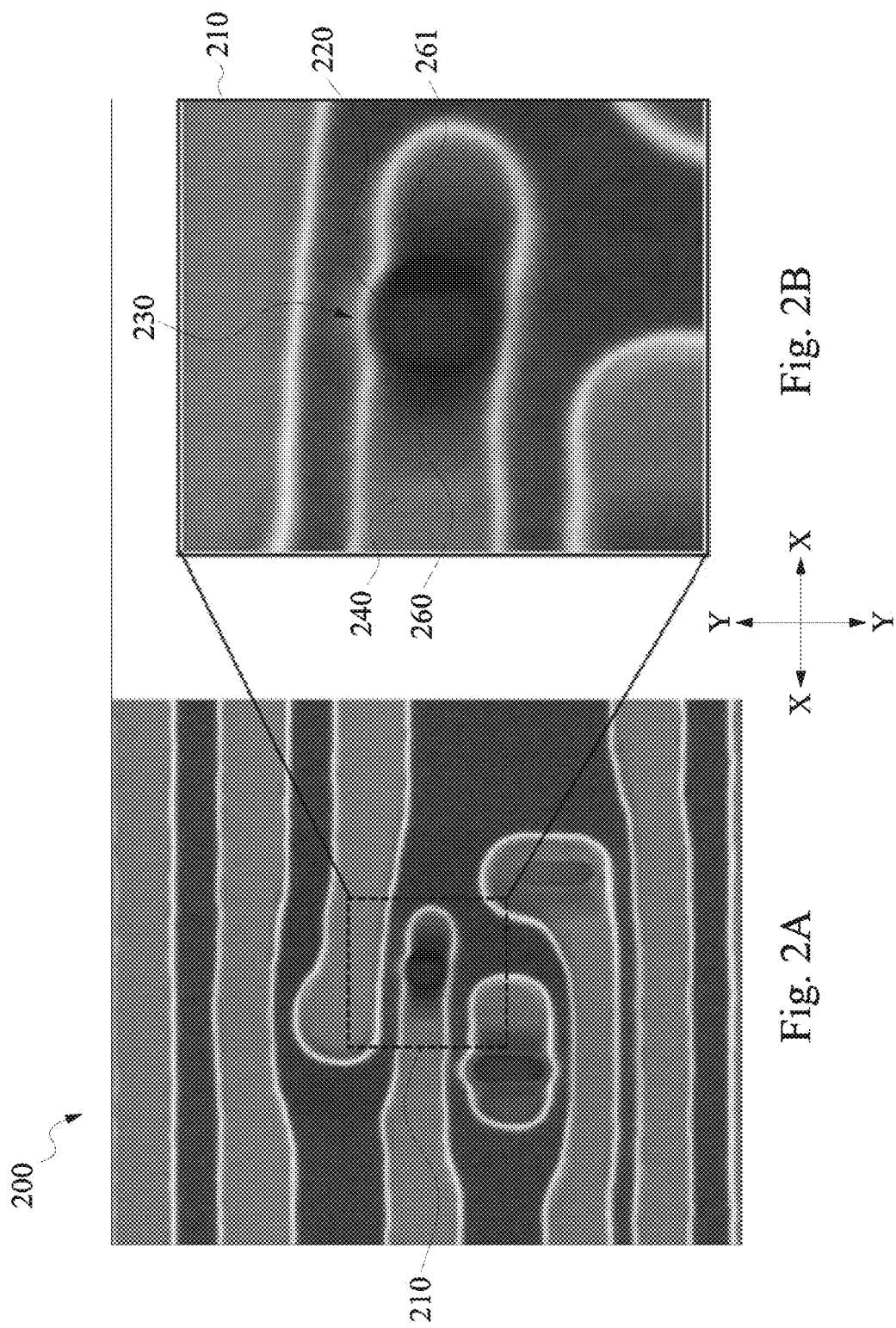

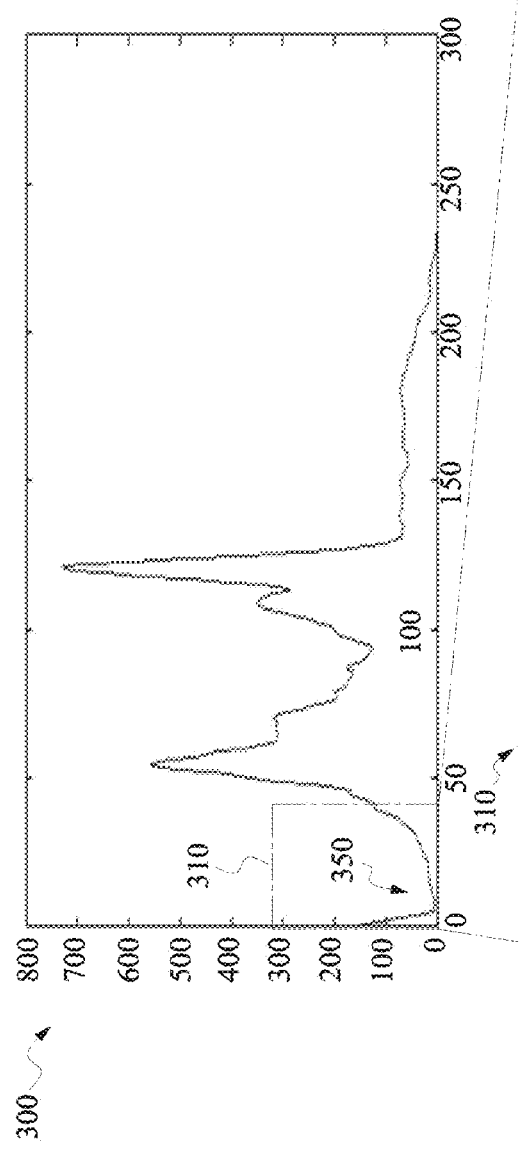
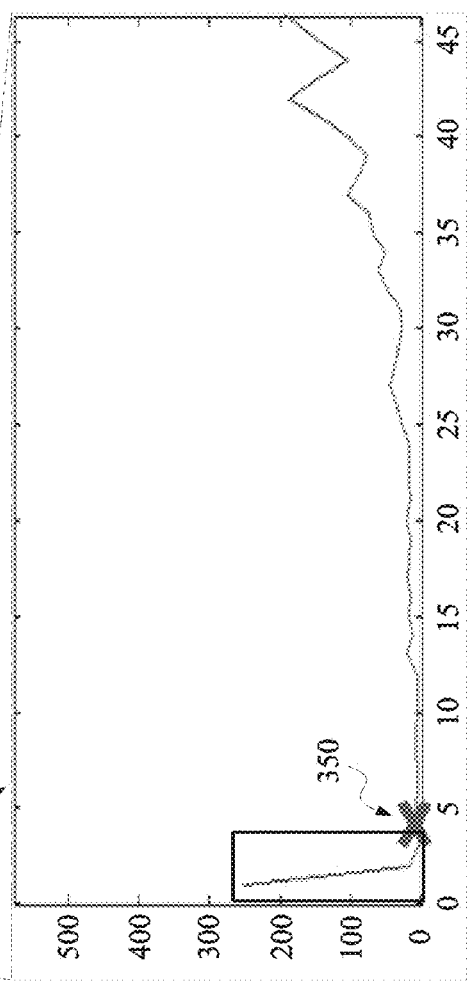

| Image | Left (mm) | Right (mm) | Difference |
|---|---|---|---|
| 1 | 4.4 | 19.1 | -14.7 |
| 2 | 8.8 | 16.2 | -7.4 |
| 3 | 4.4 | 16.2 | -11.8 |
| 4 | 5.9 | 19.1 | -13.2 |
| 5 | 11.8 | 14.7 | -2.9 |
| 6 | 11.8 | 13.2 | -1.5 |
| 7 | 4.4 | 17.6 | -13.2 |
| 8 | 8.8 | 14.7 | -5.9 |
| 9 | 14.7 | 14.7 | 0.0 |
| 10 | 8.8 | 11.8 | -2.9 |
| 11 | 10.3 | 13.2 | -2.9 |
| 12 | 17.6 | 10.3 | 7.4 |
| 13 | 14.7 | 8.8 | 5.9 |
| 14 | 17.6 | 4.4 | 13.2 |
| 15 | 14.7 | 8.8 | 5.9 |
| 16 | 16.2 | 8.8 | 7.4 |
| 17 | 17.6 | 4.4 | 13.2 |
| 18 | 17.6 | 1.5 | 16.2 |
| 19 | 11.8 | 19.1 | -7.4 |
| 20 | 17.6 | 2.9 | 14.7 |
| 21 | 19.1 | 1.5 | 17.6 |
| 22 | 13.2 | 2.9 | 10.3 |
| 23 | 19.1 | 0.0 | 19.1 |
| 24 | 19.1 | 2.9 | 16.2 |
| 25 | 13.2 | 10.3 | 2.9 |
| 26 | 16.2 | 5.9 | 10.3 |
| 27 | 19.1 | 0.0 | 19.1 |
| 28 | 10.3 | 14.7 | -4.4 |

SYSTEM AND METHOD FOR MEASURING AND IMPROVING OVERLAY USING ELECTRONIC MICROSCOPIC IMAGING AND DIGITAL PROCESSING

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The ever-shrinking geometry size brings challenges to semiconductor fabrication. For example, as semiconductor device sizes become smaller and smaller, wafer warpage (e.g., the bending or warping of a wafer) may lead to defects some such via-induced-metal-bridge (VIMB), particularly for dies at or near an edge region of the wafer. These defects are difficult to detect and/or be corrected by conventional semiconductor fabrication methods and systems. Consequently, yields may be low, and/or customer confidence may erode.

Therefore, although existing methods and systems of fabricating semiconductor devices have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A and 2B each illustrate an electronic microscopic image showing a top view of a respective portion of a wafer according to various embodiments of the present disclosure.

FIGS. 4A-4B each include a graph illustrating a gray level distribution of the electronic microscopic images of FIGS. 2A-2B according to various embodiments of the present disclosure.

FIG. 6 is a chart illustrating the measurements that can be done based on the processed image of FIG. 5 to determine overlay according to various embodiments of the present disclosure.

DETAILED DESCRIPTION

Figure 1A:
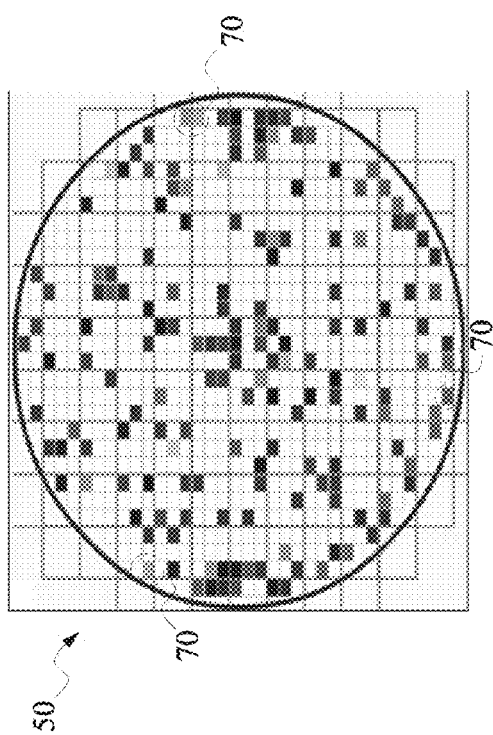
FIG. 1A is a top view of a wafer according to various embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As semiconductor fabrication technologies continue to advance, traditional fabrication systems and methods may encounter various problems. For example, as semiconductor device sizes continue to shrink, such as beyond the N28 (28-nanometer) technology node, wafer warpage may become a problem. For example, a metal layer may be formed on the surface of a wafer. The metal layer may include vias and metal lines. The wafer (and the metal layer formed thereon) may be bending or warped, for example due to a stress it experiences.

The warpage of the wafer may cause problems such as via-induced-metal-bridge (VIMB), particularly for dies located at or near an edge of the wafer. For example, referring to FIG. 1A, which is a simplified diagrammatic top view of a wafer 50. The top view of the wafer 50 shown in FIG. 1A shows a plurality of dies, some of which are located at or near an edge region of the wafer 50. In various embodiments, the edge region of the wafer 50 may be considered an outermost 10%, or 5%, or 1% of the wafer (e.g., wafer area), respectively. A plurality of dies is located within the edge region of the wafer 50. Some examples of these dies are illustrated in FIG. 1A as dies 70.

These dies 70 at the edge of the wafer 50 may be prone to the adverse effects due to the wafer warpage. For example, referring to FIG. 1B, a simplified diagrammatic cross-sectional side view of a portion of one of the dies 70 is illustrated. The portion of the die 70 illustrated includes a portion of an interconnect structure, which includes a via 100 in a Vx−1 layer, a metal line 110 in the Mx layer. The metal line 110 is disposed over the via 100. The portion of the die 70 also includes a metal line 120 in the Mx layer, a via 130 in the Vx layer, and a metal line 140 in a Mx+1 layer. The via 130 is disposed over the metal line 120, and the metal line 140 is disposed over the via 130.

Figure 1B:
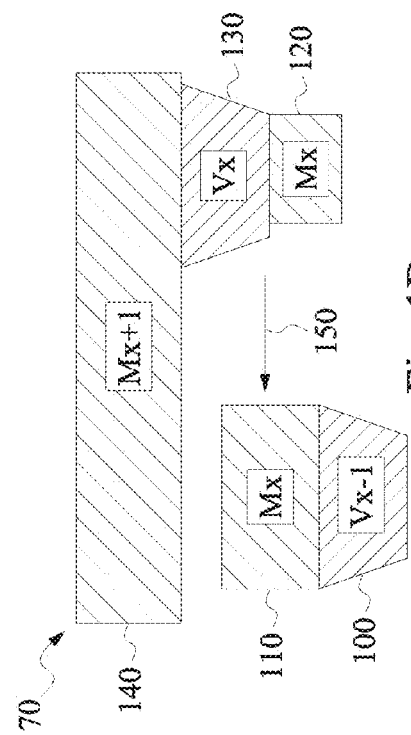
FIG. 1B is a cross-sectional view of a portion of a wafer according to various embodiments of the present disclosure.

As is shown in FIG. 1B, neither via 100 nor the metal line 110 are meant to be in direct physical contact with the metal lines 120/140 and the via 130. However, due to the wafer warpage discussed above, lithography processes performed to form the via 130 may have substantial overlay errors. In other words, the via 130 may be formed to be shifted to the left of the metal line 120, rather than being directly above and vertically aligned with the metal line 120. This overlay error may be represented by the arrow 150 pointing to the left of the via 130. Often times, the overlay error between the via 130 and the metal line 120 (due to the warpage of the wafer 50) may cause the via 130 to come into direct physical contact with the metal line 110. This defect is referred to as the via-induced-metal-bridge (VIMB) defect, and it may cause unintended electrical shorting and may lead to potential chip failure or other defects. Unfortunately, conventional semiconductor fabrication methods and systems have a difficult time detecting and correcting this defect. Consequently, device yields may be low, or customers may receive defective dies that should not have been sent out, which erodes customer satisfaction and confidence in the manufacturer.

According to the various aspects of the present disclosure, an electronic microscope is used to acquire and image of the wafer, and digital image processing is performed subsequently to the acquired image, in order to detect overlay problems. If any overlay problems exist, they may be compensated for (or corrected) in later lithography fabrication steps, as discussed in more detail below.

Referring now to FIG. 2A, an image 200 of a portion of the wafer 50 is illustrated. The image 200 shows a top view of the portion of the wafer, and the image 200 is obtained or acquired by scanning the portion of the wafer 50 with one or more beams of electrons, for example a focused ion beam. In some embodiments, the image 200 is acquired by an electron microscope, for example a Scanning Electron Microscope (SEM) tool. The SEM tool shoots out electrons that interact with atoms or particles of the portion of the wafer 50 that is being electronically scanned. This produces various signals that contain information about the surface topography and/or material composition of the portion of the wafer 50 being scanned. The SEM tool of the present disclosure has been configured to achieve a fast imaging speed. For example, unlike certain SEM tools that are configured to measure critical dimensions of semiconductor devices, which is a slow process (e.g., 10 seconds per measurement point), the SEM tool of the present disclosure is configured to take quick snap shots, which may only take 1 second per measurement point. As such, a large amount of measurement data can be obtained in relatively short amount of time.

In some embodiments, the SEM tool is a part of an electron-beam (e-beam) lithography tool, or an e-beam lithography tool with SEM capabilities. In that regard, the e-beam lithography tool is a tool capable of scanning a focused electron beams to draw custom shapes on an electron-sensitive film (e.g., resist) on a wafer surface. The solubility of the portions of the electron-sensitive film exposed by the electron beams would change. As such, the exposed portions (or alternatively, the unexposed portions) of the electron-sensitive film can be removed in a subsequent developing process. This allows small Integrated Circuit (IC) patterns to be defined. It is understood that in some alternative embodiments, the SEM tool may also be separate from a lithography tool used to fabricate the wafer 50.

In FIG. 2A, the portion of the wafer 50 that undergoes the SEM process is a die located at or near an edge region of the wafer 50, for example a portion of the die 70 shown in FIG. 1A. The portion of the die 70 shown in the image 200 is an interconnect structure, which includes a plurality of metal layers containing metal lines and vias or contacts that interconnect the metal lines. The SEM process is performed after a metal line has been formed in a lower metal layer (e.g., the Mx layer shown in FIG. 1B), and a via hole (e.g., the via hole for the via Vx in FIG. 1B) has been defined, and a metal line trench for the metal layer (e.g., the Mx+1 layer shown in FIG. 1B) has been defined, but the via hole and the metal line trench above the via hole have not been filled with a conductive material to finish the forming of the via and the metal line yet. As such, the SEM process can "see through" the metal line trench in the Mx+1 layer and the via hole, and "see" an exposed portion of the metal line in the Mx layer.

To facilitate the ensuing discussions, a region 210 of the image 200 is shown in a magnified view in FIG. 2B. The region 210 of the image includes images of a via hole 230 and a metal line trench 240. As discussed above, the via hole 230 and the metal line trench 240 have been etched open but not filled in with a conductive material yet. In some embodiments, the via hole 230 corresponds to the via 130 in the Vx layer, and the metal line trench 240 corresponds to the metal line 140 in the Mx+1 layer shown in FIG. 1B. Since the via hole 230 and the metal line trench 240 are both "open" at this point, a metal line 220 formed below the via hole 230 is exposed. The metal line 220 corresponds to the metal line 120 in the Mx layer shown in FIG. 1B. In the embodiment shown in FIG. 2A or 2B, the metal line trench 230 extends mostly along an X-direction, while the metal line 220 extends mostly along a Y-direction that is perpendicular to the X-direction.

The portion of the via hole 230 that exposes the metal line 220 may be considered to be vertically aligned with the metal line 220. However, it can be seen from FIGS. 2A-2B that some portions of the via hole 230 are not vertically aligned with the metal line 220. For example, a portion 260 of the via hole 230 is disposed to the "left" of the metal line 220 in the top view of FIG. 2B, and another portion 261 of the via hole 230 is disposed to the "right" of the metal line 220. As such, the portion 260 may be referred to as a left "lobe", and the portion 261 may be referred to as a "right" lobe, neither of which is vertically aligned with the metal line 220.

In the image 200 (e.g., SEM image) shown in FIG. 2A or 2B, these two portions 260-261 of the via hole 230 have a different visual appearance (e.g., darker) than the rest of the via hole 230. One aspect of the present disclosure is to identify these two portions 260-261 of the via hole 230 and then determine the overlay between the via hole 230 and the metal line 220 therebelow based on the size comparisons between the two portions 260-261, as discussed in more detail below.

Figure 3:
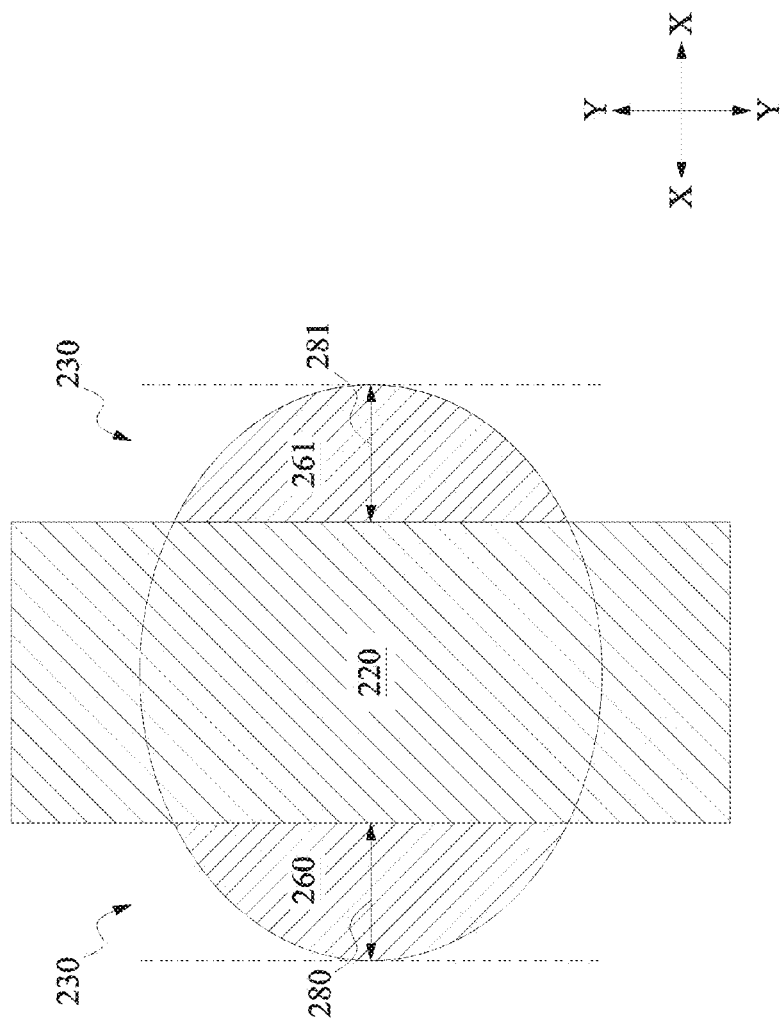
FIG. 3 is a diagrammatic top view of a portion of a wafer according to various embodiments of the present disclosure.

FIG. 3 provides a more clear top view of an example via hole 230 and the metal line 220. In more detail, the top view shown in FIG. 3 is what the image 200 (e.g., SEM image) in FIGS. 2A-2B intends to capture. As discussed above, a portion of the via hole 230 is vertically aligned with, and thus exposes, a portion of the metal line 220 therebelow, since the via hole 230 has not been filled in at this point. The portions 260 and 261 of the via hole 230 are vertically non-aligned with the metal line 220. This is because the via hole 230 has a greater lateral dimension in the X-direction than the metal line 220, and thus some portions of the via hole 230 are not located directly above the metal line 220.

Ideally, if the overlay between the via hole 230 and the metal line 220 had been perfect, then the portion 260 and the portion 261 of the via hole 230 should be substantially the same size. In other words, if the via hole 230 is aligned with the metal line 220 in a best case scenario, then the metal line 220 would "bisect" the via hole 220 symmetrically in a top view, which would leave the portions 260 and 261 (i.e., the left and right "lobes" disposed on opposite sides of the metal line 220) substantially equal to one another. As such, the degree of overlay between the via hole 230 and the metal line 220 (e.g., how well the via hole 230 is vertically aligned with the metal line 220) can be determined based on a geometric comparison between the portions 260-261 of the via hole 230.

One way to compare the portions 260 and 261 of the via hole 230 is to compare their maximum lateral dimensions in the X-direction. As shown in FIG. 3, the portion 260 has a maximum lateral dimension 280, and the portion 261 has a maximum lateral dimension 281, where the maximum lateral dimensions 280 and 281 may be defined as the widest distance (in the X-direction) between the edges of the portions 260-261 and the edges of the metal line 220 closest to them, respectively. If the dimension 280 is substantially equal to the dimension 281, then the overlay between the via hole 230 and the metal line 220 may be deemed to be close to being ideal. If the dimension 280 is substantially greater than, or smaller than the dimension 281, then the overlay between the via hole 230 and the metal line 220 may be deemed to be poor and may need correction or compensation. It is understood that some difference will exist between the dimension 280 and 281 in real world fabrication, but as long as their difference is less than a predetermined threshold, then the overlay between the via hole 230 and the metal line 220 may be deemed acceptable (even though an overlay issue exists).

In order to accurately measure the dimensions 280 and 281, the image 200 shown in FIGS. 2A-2B needs to be digitally processed to enhance the contrast between the metal line 220 and the portions 260-261 of the via hole 230. Otherwise, the original image 200 acquired from the electronic microscope scan may lack clarity for the portions 260-261 to be clearly distinguished from their surrounding elements, such as the metal line 220. According to some embodiments of the present disclosure, a "gray level distribution" analysis is performed as a part of the digital image processing.

For example, referring now to FIGS. 4A-4B, a gray level distribution graph 300 is illustrated in FIG. 4A, and a magnified portion 310 of the graph 300 in shown in a magnified view in FIG. 4B. In more detail, the region 210 of the image 200 (e.g., acquired by SEM) shown in FIG. 2B contains pixels having varying levels of gray (e.g., a gray-scale from white to black). The graph 300 provides a visual illustration of how the gray level changes throughout the different areas of the image 200. In that regard, a horizontal axis of the graph 300 represents the varying levels of gray (e.g., from 0 to 255, with 0 being the darkest, and 255 being the lightest), and the vertical axis of the graph 300 represents the number of pixels in the region 210 of the image 200 having the corresponding gray level.

In order to increase the contrast between the portions 260-261 of the via hole 230 and their neighboring regions, a gray level threshold 350 is defined, as is shown in the graph 300 but more clearly in the magnified portion 310 of the graph. As discussed above, the two portions 260-261 of the via hole 230 are substantially darker than the rest of the areas in the region 210 of the image 200. The pixels that make up the portions 260-261 of the via hole 230 are represented by the pixels below (i.e., to the left of) the threshold 350. In the illustrated embodiment, the threshold 350 is defined between a gray level of 3 and 5, for example 4, in a gray scale from 0 to 255. It is understood that the threshold 350 is not statically defined for all cases or SEM images. Rather, the threshold 350 may be adaptively defined in each image.

Based on the threshold 350, the region 210 of the image 200 is filtered in a binary manner. That is, pixels having a gray level below the threshold 350 are sorted in one group, while pixels having a gray level above the threshold 350 are sorted in another group. To further enhance the contrast, one of these groups may be colored white, while the other group may be colored black. As a result, the region 210 of the image 200 can be transformed into an image having only black and white elements. This process may be referred to as a "thresholding" analysis, and it may be performed in a computerized manner using Matlab code, for example using the built-in functions such as graythresh( ), multithresh( ), histogramCounts, etc. The thresholding analysis may also be performed using other suitable computerized tools capable of performing digital image processing, for example JavaScript. It is also understood that in other embodiments, the two separated groups need not necessarily be white and black. They may be transformed into other colors or gray levels, as long as the contrast between them is significant enough to clearly distinguish the left and right "lobes" 260-261 of FIG. 2B.

In some embodiments, this "thresholding" analysis discussed above utilizes a clustering-based image thresholding known as "Otsu's method." Otsu's method contains an algorithm to reduce a gray level image to a binary image. The algorithm assumes that the image contains two classes of pixels following bi-modal histogram (foreground pixels and background pixels). It then calculates the optimum threshold separating the two classes so that their combined spread (intra-class variance) is minimal, or equivalently (because the sum of pairwise squared distances is constant), so that their inter-class variance is maximal. Otsu's method (or any modified version thereof) may be carried out using Matlab code or JavaScript as well.

Figure 5:
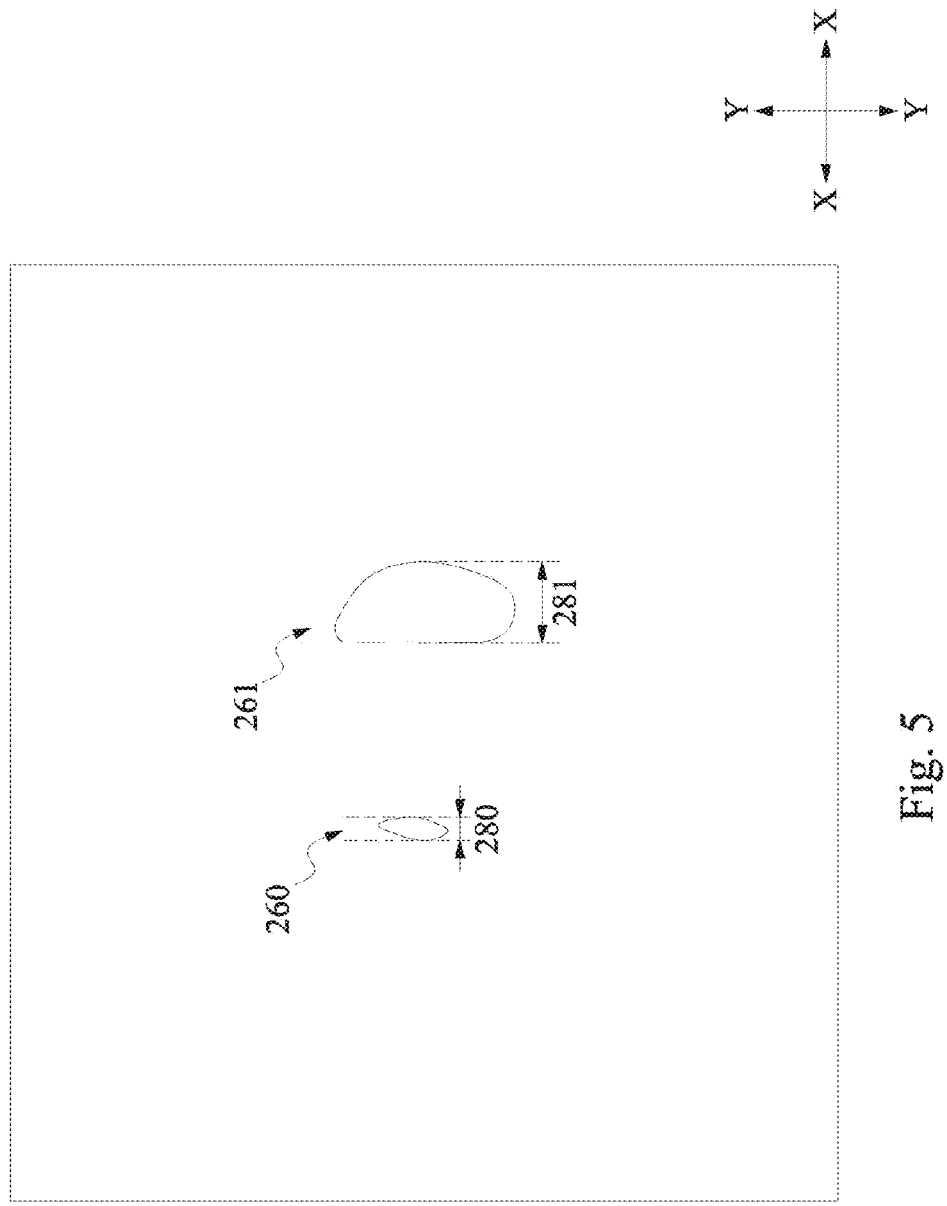
FIG. 5 is a top view of a portion of a wafer after having undergone image processing according to various embodiments of the present disclosure.

A visual example of the result of the digital image processing is shown in FIG. 5, where the two portions 260-261 of the via hole 230 are represented by two white regions that are surrounded by black regions. In other words, the pixels corresponding to the portions 260-261 in the image 200 in FIGS. 2A-2B are turned "white" as a result of the digital image processing discussed above, while the rest of the pixels corresponding to all other elements in the image (including the metal line 220) are turned "black", irrespective of their specific gray levels. As such, a clear visual contrast is obtained between the portions 260-261 of the via hole and the metal line 220, as the boundaries of the metal line 220 would correspond to the dark area between the portions 260-261 in FIG. 5. Next, the maximum lateral dimension 280 of the portion 260 and the maximum lateral dimension 281 of the portion 261 are measured. The differences between the lateral dimensions 280-281 may then be calculated.

FIG. 6 illustrates a chart 350 that shows the measurement data of the lateral dimensions 280-281 and their calculated differences for a plurality of samples. In more detail, the graph 350 contains a plurality of rows 1-28, each of which corresponds to a different sample image. These samples may be taken from different dies or different parts of the same die. In some embodiments, the samples are all taken from the dies that are located at or near the edge region of a wafer, and each SEM image is taken from the same location of a corresponding die, for example at an upper right location of the die, or a bottom left location of the die. The specific location on the die is where the region 210 of FIGS. 2A-2B (or a similar region) is located.

Still referring to FIG. 6, the column "Left (nm)" lists the measurement data of the dimension 280 for each of the samples, and the column "Right (nm)" lists the measurement data of the dimension 281 for each of the samples, and the column "Difference" lists the calculated difference between the dimensions 280 and 281. As discussed above, as the difference between the dimensions 280 and 281 becomes smaller (e.g., approaches 0), the overlay between the via hole 230 and the metal line 220 (see FIGS. 2A/2B-3) improves. Conversely, as the difference (either positively or negatively) between the dimensions 280 and 281 becomes larger, the overlay between the via hole 230 and the metal line 220 worsens. Based on the sample set shown in the graph 350, the sample corresponding to image 27 has the worst overlay problem, as the difference between the dimensions 280 and 281 is 19.1 (the largest in the group). The sample corresponding to image 9 has the best overlay, as the difference between the dimensions 280 and 281 is 0 (the smallest in the group).

Based on the above discussions, it can be seen that overlay problems can be detected by acquiring an image of an area of interest on a wafer via an electronic microscope, and then performing digital image processes (and data conversion, if needed) on the acquired image. In comparison, conventional semiconductor systems and methods of measuring overlay typically involve overlay marks that are physically formed on wafers, for example in a test line of a wafer. These overlay marks may come in different shapes and sizes, for example in a box-in-box configuration. Whereas using the overlay marks to measure overlay involves an optics-oriented methodology (e.g., optically "seeing" whether an inner box is located within an outer box), the present disclosure involves an electronic microscopic scan.

Using the electronic microscopic scan (and digital image processing) to measure overlay offers several advantages over the traditional optical overlay mark methodology. For example, the optical overlay mark methodology requires doing object matching in "special" locations, but this does not apply to the electronic microscopic scan. Another advantage is that it is easier to perform customizations for the electronic microscopic scan methodology, since it does not involve actual IC layout modifications (which would have been required for the optical overlay mark methodology). Yet another advantage is that the electronic microscopic scan methodology can directly examine a "current" layer, whereas the optical overlay mark methodology needs to do an indirect examination by comparing with a previous layer. Other advantages include the ability of the electronic microscopic scan methodology to be performed faster than the optical overlay mark methodology, and the fact that the electronic microscopic scan methodology can be performed anywhere on the wafer, whereas the optical overlay mark methodology is typically limited to test line regions of the wafer.

Another benefit of the electronic microscopic scan methodology discussed above is that any overlay problems, once detected, can be quickly corrected or compensated for in a later fabrication stage. An example lithography tool may be an immersion lithography tool, which replaces the air gap between the wafer surface and the lens with a liquid medium such as purified water. In other words, at least a part of the wafer undergoing fabrication is "immersed" under the liquid medium. Light would travel down through a system of lenses and through the liquid medium before reaching a resist material formed on the wafer surface. It is understood that the lithography tool is not limited to an immersion lithography tool, however, and it may include another type of lithography tool. In any case, the lithography tool is capable of performing one or more stages of wafer fabrication following the overlay measurement (using the electronic microscopic scan) discussed above. Fabrication process parameters can be adjusted in these subsequent fabrication stages to account for, or compensate for, any overlay problems that have been detected between the via hole and the metal line 220.

Figure 7:
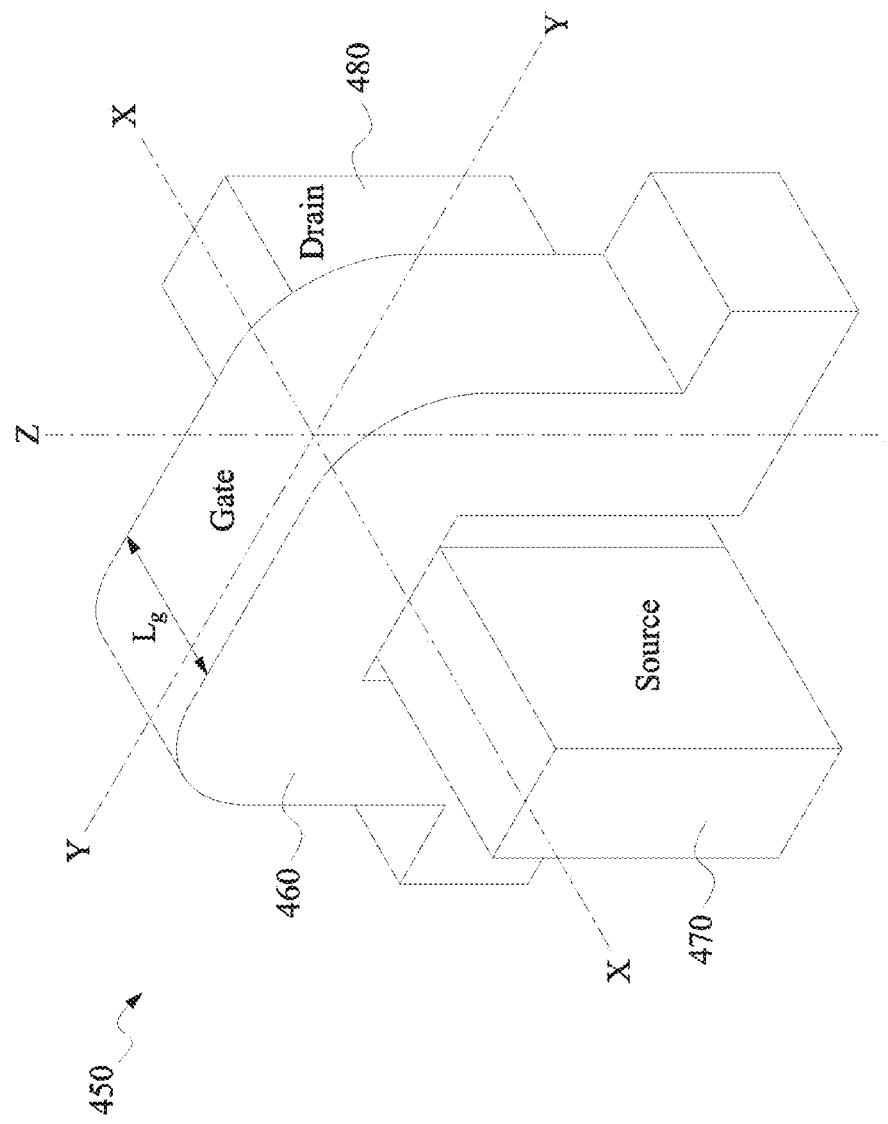
FIG. 7 is a perspective view of an example semiconductor device that can be fabricated according to various embodiments of the present disclosure.

It is understood that the embodiments of the present disclosure may be used to form a variety of types of semiconductor devices. For example, in addition to being used in the fabrication of conventional "planar" semiconductor devices, the present disclosure may be used in the fabrication of FinFET devices, for example a FinFET device illustrated in FIG. 7. In more detail, FIG. 7 illustrates a perspective view of an example FinFET device 450. A FinFET—or a fin-like field-effect transistor (FinFET) device—may be a complementary metal-oxide-semiconductor (CMOS) device including a P-type metal-oxide-semiconductor (PMOS) FinFET device and/or an N-type metal-oxide-semiconductor (NMOS) FinFET device.

The FinFET device 450 is a non-planar multi-gate transistor that is built on a substrate. A thin silicon "fin-like" structure (referred to as fin) forms the body of the FinFET device 450. A gate 460 of the FinFET device 450 is wrapped around this fin. Lg denotes a length (or width, depending on the perspective) of the gate 460. A source 470 and a drain 480 of the FinFET device 450 are formed in extensions of the fin on opposite sides of the gate 460. The fin itself serves as a channel. The effective channel length of the FinFET device 450 is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

Figure 8:
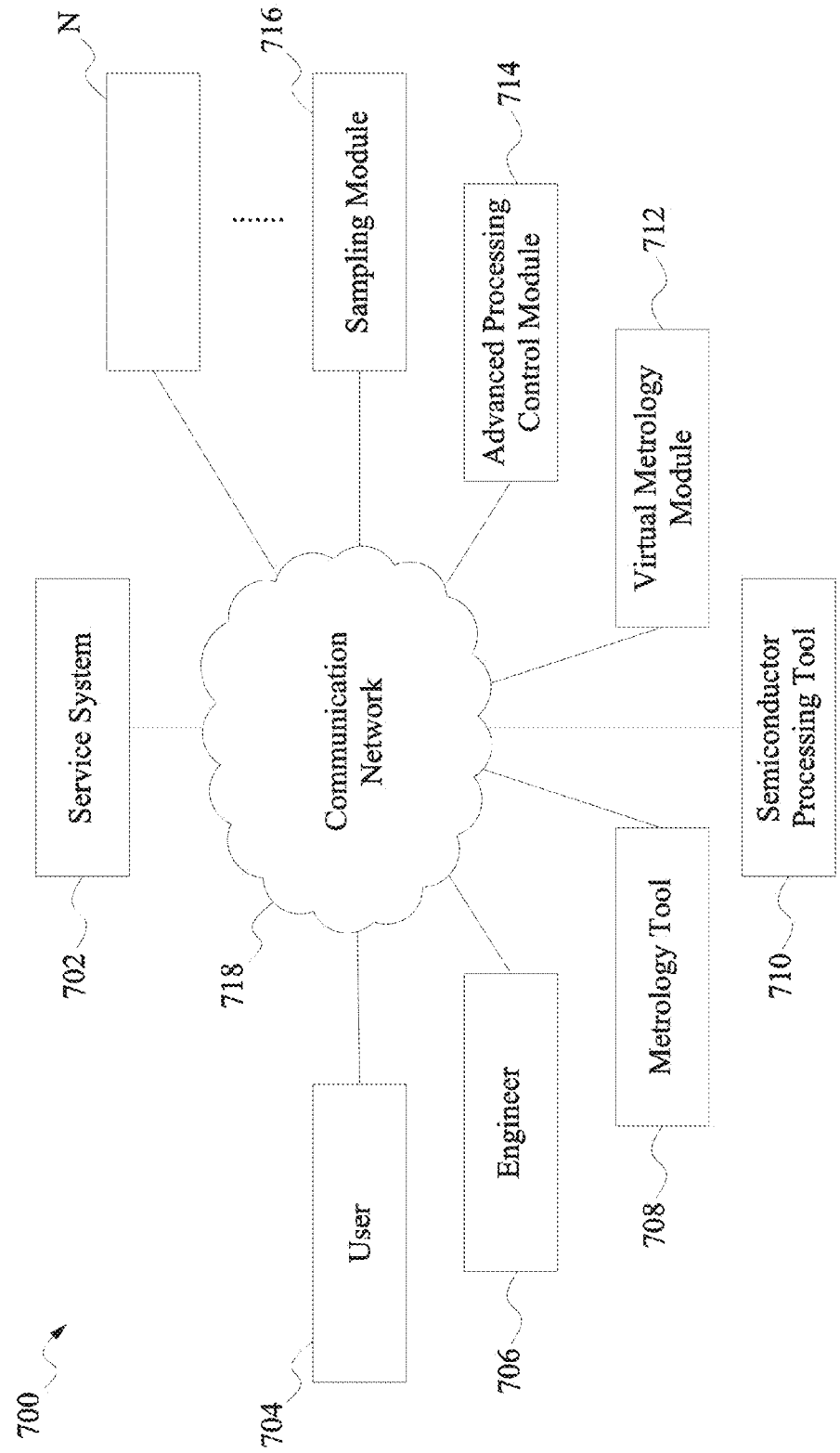
FIG. 8 illustrates an integrated circuit fabrication system according to various embodiments of the present disclosure.

FIG. 8 illustrates an integrated circuit fabrication system 700 according to embodiments of the present disclosure. The fabrication system 700 includes a plurality of entities 702, 704, 706, 708, 710, 712, 714, 716 . . . , N that are connected by a communications network 718. The network 718 may be a single network or may be a variety of different networks, such as an intranet and the Internet, and may include both wire line and wireless communication channels.

In an embodiment, the entity 702 represents a service system for manufacturing collaboration; the entity 704 represents an user, such as product engineer monitoring the interested products. The entity 706 represents an engineer, such as a processing engineer to control process and the relevant recipes, or an equipment engineer to monitor or tune the conditions and setting of the processing tools. The entity 708 represents a metrology tool for IC testing and measurement. The entity 710 represents a semiconductor processing tool, such as the SEM tool or the e-beam tool with SEM imaging capabilities discussed above, or the immersion lithography tool discussed above. In some embodiments, the e-beam tool of the entity 710 may be implemented at least in part according U.S. Pat. No. 8,601,407, filed on Sep. 6, 2011 and issued on Dec. 3, 2013, entitled "Stripping Methodology for Maskless Lithography", the disclosure of which is hereby incorporated by reference in its entirety. The entity 712 represents a virtual metrology module associated with the processing tool 710. The entity 714 represents an advanced processing control module associated with the processing tool 710 and additionally other processing tools. The entity 716 represents a sampling module associated with the processing tool 710.

It is understood that a computerized controller with hardware processors may be integrated into one or more of these entities 702-716. The hardware processors are configured to execute computerized instructions to perform one or more operations, such as the various processes of the present disclosure discussed above (e.g., digital image processing, measuring the sizes of the lobes of the via hole, determining overlay, and performing compensation in subsequent processes).

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 714 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks, such as the tasks associated with optimizing the CCR values as discussed above.

The integrated circuit fabrication system 700 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results. For example, once excessive overlay is detected by the processes discussed above, the system 700 adjusts the subsequent fabrication processes performed to the same wafer to compensate for the excessive overlay.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 700 may enable collaboration and information access in such areas as design, engineering, and processing, metrology, and advanced processing control. Another capability provided by the IC fabrication system 700 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 9:
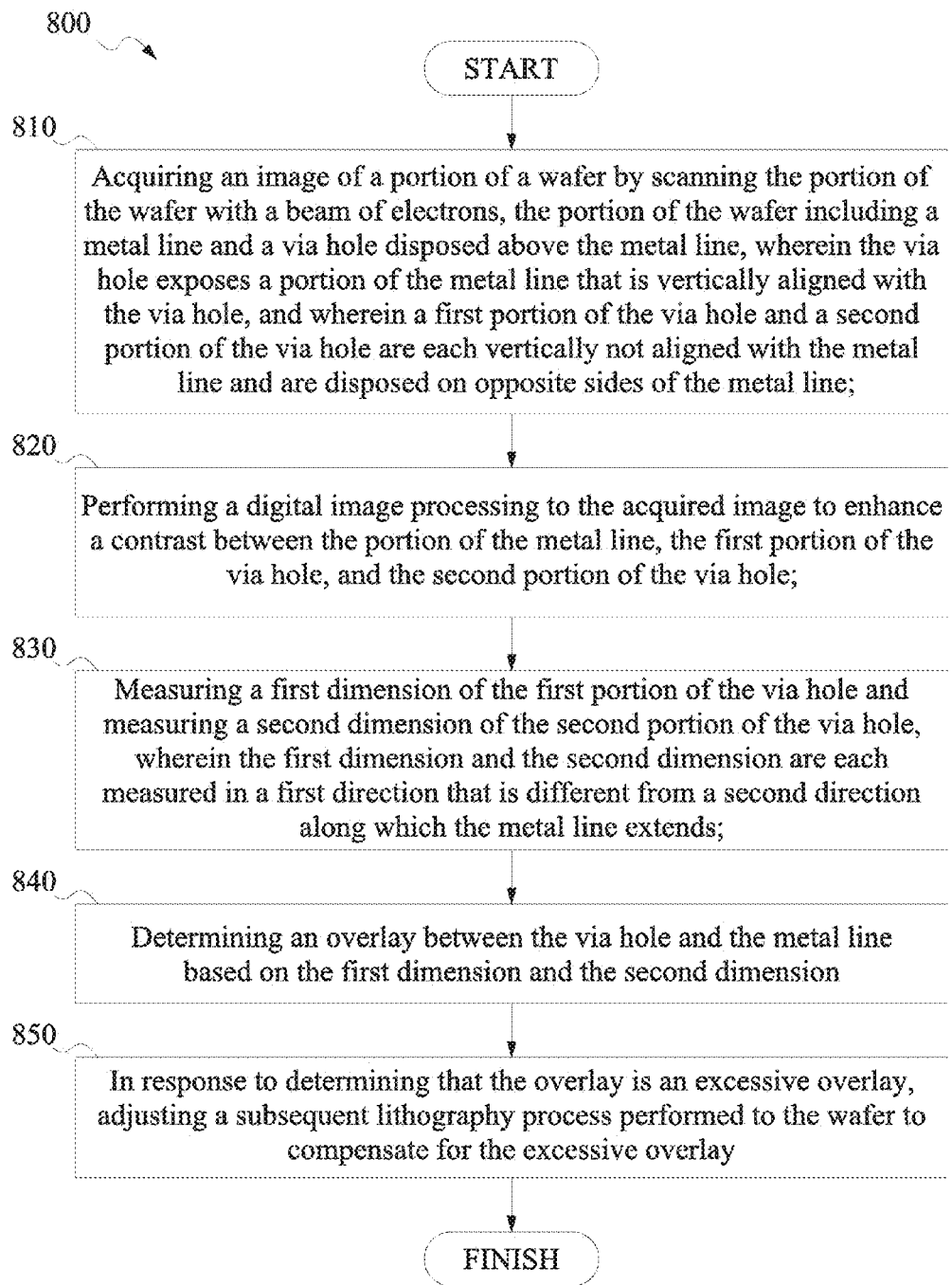
FIG. 9 is a flowchart illustrating a method of fabricating a semiconductor device according to embodiments of the present disclosure.

FIG. 9 is a flowchart illustrating a method 800 of fabricating a semiconductor device according to embodiments of the present disclosure. The method 800 includes a step 810 of acquiring an image of a portion of a wafer by scanning the portion of the wafer with a beam of electrons. The portion of the wafer including a metal line and a via hole disposed above the metal line. The via hole exposes a portion of the metal line that is vertically aligned with the via hole. A first portion of the via hole and a second portion of the via hole are each vertically not aligned with the metal line and are disposed on opposite sides of the metal line. In some embodiments, the step 810 of acquiring the image is performed after a trench of a further metal line has been formed above the via hole, but before the trench has been filled with a conductive material. In some embodiments, the step 810 of acquiring the image is performed using a scanning electron microscope (SEM) of an electron-beam lithography machine. In some embodiments, the portion of the wafer is located at or near an edge of the wafer.

The method 800 includes a step 820 of performing a digital image processing to the acquired image to enhance a contrast between the portion of the metal line, the first portion of the via hole, and the second portion of the via hole. In some embodiments, the digital image processing comprises analyzing a gray level distribution of the image, and applying a gray level threshold to the image. Regions of the image darker than the gray level threshold will be transformed into a first color (or first gray level), while regions of the image lighter than the gray level threshold will be transformed into a second color (or second gray level) having a high contrast with the first color (or the first gray level).

The method 800 includes a step 830 of measuring a first dimension of the first portion of the via hole and measuring a second dimension of the second portion of the via hole. The first dimension and the second dimension are each measured in a first direction that is different from a second direction along which the metal line extends. In some embodiments, the first direction is perpendicular to the second direction.

The method 800 includes a step 840 of determining an overlay between the via hole and the metal line based on the first dimension and the second dimension. In some embodiments, the determining step 840 comprises calculating a difference between the first dimension and the second dimension.

The method 800 includes a step 850 of, in response to determining that the overlay is an excessive overlay, adjusting a subsequent lithography process performed to the wafer to compensate for the excessive overlay.

It is understood that additional steps may be performed to complete the method 800 of fabricating the semiconductor device. For example, the semiconductor may undergo one or more deposition, patterning, packaging, or testing processes However, for reasons of simplicity these additional steps are not discussed herein in detail.

Figure 10:
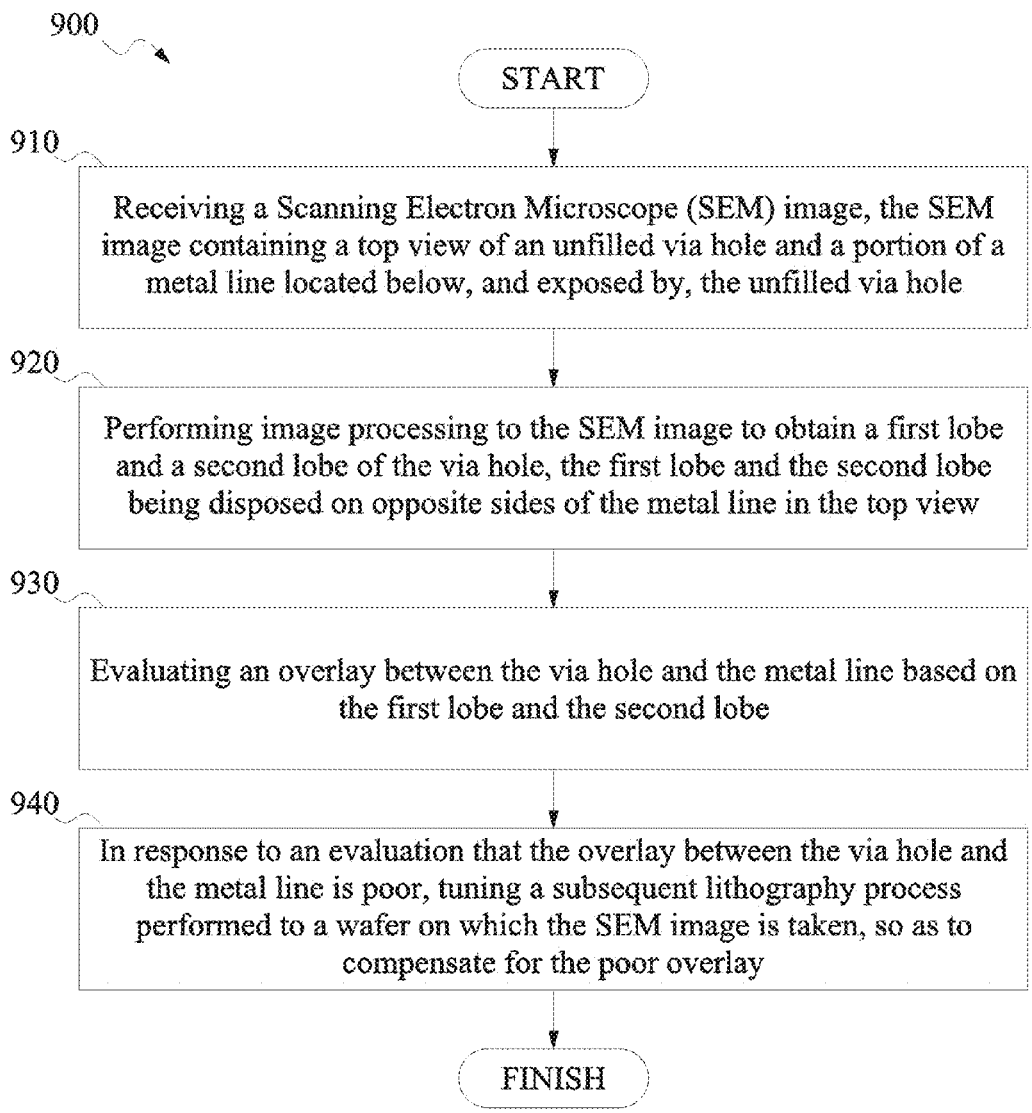
FIG. 10 is a flowchart illustrating a method of fabricating a semiconductor device according to embodiments of the present disclosure.

FIG. 10 is a flowchart illustrating a method 900 of fabricating a semiconductor device according to embodiments of the present disclosure. The method 900 includes a step 910 of receiving a Scanning Electron Microscope (SEM) image. The SEM image contains a top view of an unfilled via hole and a portion of a metal line located below, and exposed by, the unfilled via hole. In some embodiments, the SEM image is received from an electron-beam lithography tool with SEM imaging capabilities. In some embodiments, the SEM image is taken on an edge region of a wafer on which the via hole and the metal line are located.

The method 900 includes a step 920 of performing image processing to the SEM image to obtain a first lobe and a second lobe of the via hole. The first lobe and the second lobe are disposed on opposite sides of the metal line in the top view.

The method 900 includes a step 930 of evaluating an overlay between the via hole and the metal line based on the first lobe and the second lobe. In some embodiments, the evaluating comprises: measuring a first dimension of the first lobe and a second dimension of the second lobe, the first dimension and the second dimension being measured along a direction perpendicular to a direction along which the metal line extends. Thereafter, a difference between the first dimension and the second dimension is calculated. The overlay is then determined based on the calculated difference.

The method 900 includes a step 940 of, in response to an evaluation that the overlay between the via hole and the metal line is poor, tuning a subsequent lithography process performed to a wafer on which the SEM image is taken, so as to compensate for the poor overlay.

The present disclosure offers advantages over conventional semiconductor devices and the fabrication thereof. It is understood, however, that other embodiments may offer additional advantages, and not all advantages are necessarily disclosed herein, and that no particular advantage is required for all embodiments. One advantage is that the embodiments of the present disclosure allows for easy, accurate, and convenient overlay detection/measurement. Compared to conventional overlay measurement methodologies using overlay marks formed on a wafer, the embodiments discussed herein use an electronic microscopic scanning tool (such as an e-beam tool with SEM capabilities) to capture an image of an area of interest, where overlay problems may exist. The captured image may then be digitally processed to enhance the contrast between certain elements, such as between the left and right lobes of a via hole and their surrounding regions. Measurements may then be performed (e.g., measuring the sizes of the lobes of the via hole) to determine the overlay. Once an excessive overlay is detected, the embodiments of the present disclosure may then adjust the subsequent fabrication processing of the wafer to compensate for the overlay. Consequently, overlay problems can be caught in time and corrected when possible. This is especially helpful for regions of the wafer where overlay problems may otherwise induce failures, such as via-induced-metal-bridge defects due to the bending or warping of the wafer. Also, as device sizes continue to shrink with each technology, the techniques disclosed herein will offer improved overlay measurement performance compared to conventional overlay measurement methodologies, for example improvements in terms of speed, flexibility, and versatility.

One aspect of the present disclosure involves a method of fabricating a semiconductor device. An image of a portion of a wafer is acquired by scanning the portion of the wafer with a beam of electrons. The portion of the wafer includes a metal line and a via hole disposed above the metal line. The via hole exposes a portion of the metal line that is vertically aligned with the via hole. A first portion of the via hole and a second portion of the via hole are each vertically not aligned with the metal line and are disposed on opposite sides of the metal line. The acquired image is processed to enhance a contrast between the first portion and the second portion of the via hole and their surrounding areas. A first dimension of the first portion of the via hole is measured, and a second dimension of the second portion of the via hole is measured. The first dimension and the second dimension are each measured in a first direction that is different from a second direction along which the metal line extends. An overlay between the via hole and the metal line is determined based on the first dimension and the second dimension.

Another aspect of the present disclosure involves a method of fabricating a semiconductor device. A Scanning Electron Microscope (SEM) image is received. The SEM image contains a top view of an unfilled via hole and a portion of a metal line located below, and exposed by, the unfilled via hole. Image processing is performed to the SEM image to obtain a first lobe and a second lobe of the via hole. The first lobe and the second lobe are disposed on opposite sides of the metal line in the top view. An overlay between the via hole and the metal line is evaluated based on the first lobe and the second lobe.

Yet another aspect of the present disclosure involves a semiconductor fabrication system. The semiconductor fabrication system includes a semiconductor fabrication tool configured to acquire an image of a portion of a wafer by scanning the portion of the wafer with a beam of electrons. The portion of the wafer includes a metal line and a via hole disposed above the metal line. The via hole exposes a portion of the metal line that is vertically aligned with the via hole. A first portion of the via hole and a second portion of the via hole are each vertically not aligned with the metal line and are disposed on opposite sides of the metal line. The semiconductor fabrication system includes one or more hardware processors configured to execute instructions to perform operations that include: processing the acquired image to enhance a contrast between the first portion and the second portion of the via hole and their surrounding areas; measuring a first dimension of the first portion of the via hole and measuring a second dimension of the second portion of the via hole, wherein the first dimension and the second dimension are each measured in a first direction that is different from a second direction along which the metal line extends; and determining an overlay between the via hole and the metal line based on the first dimension and the second dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor fabrication, comprising:
acquiring an image of a portion of a wafer by scanning the portion of the wafer with a beam of electrons, the portion of the wafer including a metal line and a via hole disposed above the metal line, wherein the via hole exposes a portion of the metal line that is vertically aligned with the via hole, and wherein a first portion of the via hole and a second portion of the via hole are each vertically not aligned with the metal line and are disposed on opposite sides of the metal line;
processing the acquired image to enhance a contrast between the first portion and the second portion of the via hole and their surrounding areas;
measuring a first dimension of the first portion of the via hole and measuring a second dimension of the second portion of the via hole, wherein the first dimension and the second dimension are each measured in a first direction that is different from a second direction along which the metal line extends; and
determining an overlay between the via hole and the metal line based on the first dimension and the second dimension.

2. The method of claim 1, wherein the portion of the wafer is located at or near an edge of the wafer.

3. The method of claim 1, wherein the acquiring the image is performed after a trench of a further metal line has been formed above the via hole, but before the trench has been filled with a conductive material.

4. The method of claim 1, wherein the acquiring the image is performed using a scanning electron microscope (SEM) of an electron-beam lithography machine.

5. The method of claim 1, wherein the processing the acquired image comprises:
analyzing a gray level distribution of the image; and
applying a gray level threshold to the image.

6. The method of claim 1, wherein the first direction is perpendicular to the second direction.

7. The method of claim 1, wherein the determining comprises calculating a difference between the first dimension and the second dimension.

8. The method of claim 1, further comprising: in response to determining that the overlay is an excessive overlay, adjusting a subsequent lithography process performed to the wafer to compensate for the excessive overlay.

9. A semiconductor fabrication system, comprising:
a semiconductor fabrication tool configured to acquire an image of a portion of a wafer by scanning the portion of the wafer with a beam of electrons, the portion of the wafer including a metal line and a via hole disposed above the metal line, wherein the via hole exposes a portion of the metal line that is vertically aligned with the via hole, and wherein a first portion of the via hole and a second portion of the via hole are each vertically not aligned with the metal line and are disposed on opposite sides of the metal line; and
one or more hardware processors configured to execute instructions to perform operations that include:
processing the acquired image to enhance a contrast between the first portion and the second portion of the via hole and their surrounding areas;
measuring a first dimension of the first portion of the via hole and measuring a second dimension of the second portion of the via hole, wherein the first dimension and the second dimension are each measured in a first direction that is different from a second direction along which the metal line extends; and
determining an overlay between the via hole and the metal line based on the first dimension and the second dimension.

10. The semiconductor fabrication system of claim 9, wherein the portion of the wafer is located at or near an edge of the wafer.

11. The semiconductor fabrication system of claim 9, wherein the semiconductor fabrication tool is configured to acquire the image after a trench of a further metal line has been formed above the via hole, but before the trench has been filled with a conductive material.

12. The semiconductor fabrication system of claim 9, wherein the semiconductor fabrication tool includes an electron-beam lithography machine with scanning electron microscope (SEM) capabilities.

13. The semiconductor fabrication system of claim 9, wherein the processing the acquired image comprises:
analyzing a gray level distribution of the image; and
applying a gray level threshold to the image.

14. The semiconductor fabrication system of claim 9, wherein the first direction is perpendicular to the second direction.

15. The semiconductor fabrication system of claim 9, wherein the determining comprises calculating a difference between the first dimension and the second dimension.

16. The semiconductor fabrication system of claim 9, further comprising a lithography tool that is configured perform a subsequent lithography process to the wafer, and wherein the operations performed by the one or more hardware processors further comprise: in response to determining that the overlay is an excessive overlay, instructing the lithography tool to adjust the subsequent lithography process performed to the wafer to compensate for the excessive overlay.

17. A method of semiconductor fabrication, comprising:
acquiring an image of an edge portion of a wafer by scanning the edge portion of the wafer with a beam of electrons, the edge portion of the wafer including a metal line and a via hole disposed above the metal line, wherein the via hole exposes a portion of the metal line that is vertically aligned with the via hole, and wherein a first portion of the via hole and a second portion of the via hole are each vertically not aligned with the metal line and are disposed on opposite sides of the metal line;
processing the acquired image to enhance a contrast between the first portion and the second portion of the via hole and their surrounding areas;
measuring a first dimension of the first portion of the via hole and measuring a second dimension of the second portion of the via hole, wherein the first dimension and the second dimension are each measured in a first direction that is perpendicular to a second direction along which the metal line extends;
determining an overlay between the via hole and the metal line at least in part by calculating a difference between the first dimension and the second dimension; and
in response to determining that the overlay is greater than a predetermined limit, adjusting a subsequent lithography process performed to the wafer to reduce the overlay.

18. The method of claim 17, wherein the acquiring the image is performed after a trench of a further metal line has been formed above the via hole, but before the trench has been filled with a conductive material.

19. The method of claim 17, wherein the acquiring the image is performed using a scanning electron microscope (SEM) of an electron-beam lithography machine.

20. The method of claim 17, wherein the processing the acquired image comprises:
    analyzing a gray level distribution of the image; and
    applying a gray level threshold to the image.

\* \* \* \* \*